United States Patent [19]

Apschel et al.

[11] Patent Number: 4,869,777
[45] Date of Patent: Sep. 26, 1989

[54] METHOD FOR SELECTIVELY ETCHING THE MATERIALS OF A COMPOSITE OF TWO MATERIALS

[75] Inventors: Morris Apschel; Frank D. Egitto, both of Binghamton; Ronald S. Horwath, Endwell; Gad Koren, Yorktown Heights, all of N.Y.

[73] Assignee: IBM Corporation, Armonk, N.Y.

[21] Appl. No.: 285,446

[22] Filed: Dec. 16, 1988

[51] Int. Cl.⁴ .............. B44C 1/22; C03C 15/00; C03C 25/06; B29C 37/00
[52] U.S. Cl. .................... 156/626; 156/643; 156/646; 156/659.1; 156/668; 204/192.33; 204/192.36
[58] Field of Search ......... 156/626, 627, 643, 646, 156/655, 659.1, 668; 204/192.32, 192.33, 192.36; 427/8, 38, 39

[56] References Cited

U.S. PATENT DOCUMENTS

| | | | |
|---|---|---|---|
| 4,092,210 | 5/1978 | Hoepfner | 156/643 |
| 4,341,592 | 7/1982 | Shortes et al. | 156/646 X |
| 4,417,947 | 11/1983 | Pan | 156/646 X |
| 4,462,863 | 7/1984 | Nishimatsu et al. | 156/643 |
| 4,512,868 | 4/1985 | Fujimura et al. | 204/298 |
| 4,576,692 | 3/1986 | Fukuta et al. | 204/165 |
| 4,673,456 | 6/1987 | Spencer et al. | 156/345 |
| 4,718,974 | 1/1988 | Minaee et al. | 156/643 |
| 4,718,976 | 1/1988 | Fujimura et al. | 156/643 |
| 4,738,748 | 4/1988 | Kisa et al. | 156/643 |

Primary Examiner—William A. Powell
Attorney, Agent, or Firm—William N. Hogg

[57] ABSTRACT

A method of etching in an $O_2$ microwave plasma is provided which has a predetermined selectivity between a composite of two materials such as a photoresist and a polyimide is provided. The etch rate of each of the materials is measured at various temperatures and pressures, and this composite is then etched at a selected temperature and pressure which will provide the desired degree of selectivity.

6 Claims, 3 Drawing Sheets

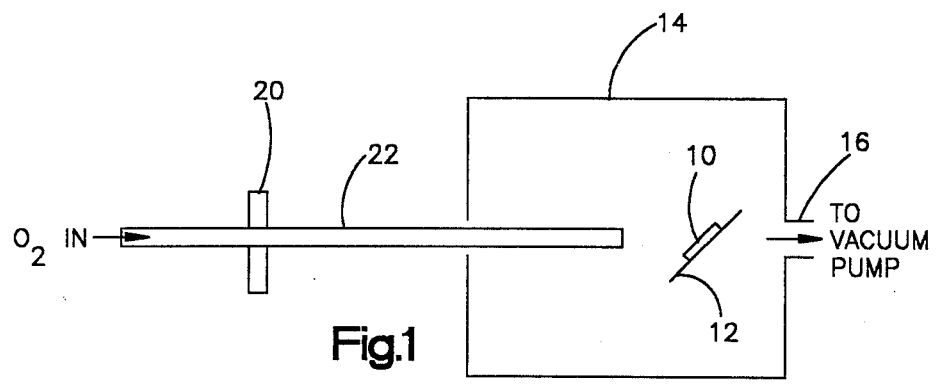
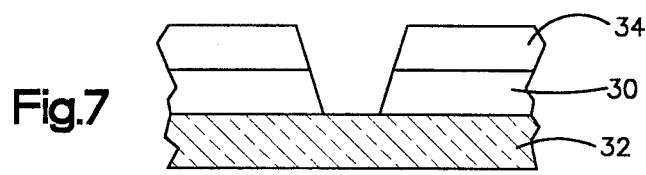
Fig.7
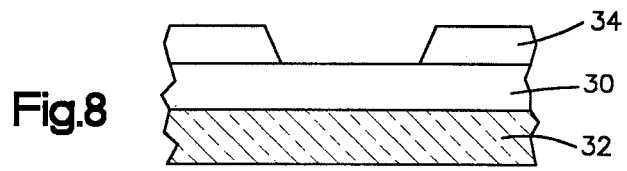
Fig.8
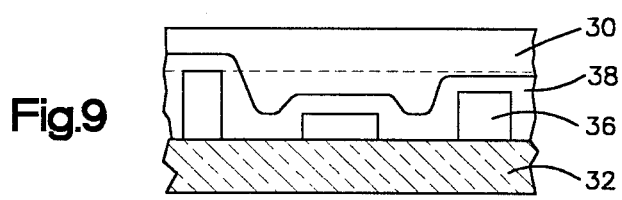
Fig.9

METHOD FOR SELECTIVELY ETCHING THE MATERIALS OF A COMPOSITE OF TWO MATERIALS

BACKGROUND OF THE INVENTION

1. Field of the Invention

This invention relates generally to the etching of various materials downstream from microwave generated $O_2$ Plasma, and more particularly to a method of controlling the selectivity of the etching of the materials in a composite of two materials in this type etching. In even more particular aspects this invention is related to the controlling of the etch selectivity downstream from a microwave generated $O_2$ plasma for a composite of a polyimide material and a photoresist material.

2. Description of the Prior Art

Etching or "ashing" of various photoresist materials using $O_2$ microwave generated plasma is well known in the art. U.S. Pat. No. 4,738,748 discusses the technique of ashing or etching of photoresist material. U.S. Pat. No. 4,341,592 assigned to Texas Instruments, Inc. further teaches the use of $O_2$ microwave plasma for etching photoresist material and this patent also discusses the effect of various temperatures on the etching rate of various positive and negative photoresist materials in an $O_2$ microwave material generated plasma.

U.S. Pat. Nos. 4,576,692; 4,718,976; 4,718,974; 4,673,456; 4,512,868; and 4,462,863 also suggest various arrangements for generation of $O_2$ microwave plasma for various type of etching.

However, in many cases it is important to assure the selectivity of etching of various materials particularly photoresist materials and polyimide materials which are often formed in a composite configuration for many different processes such as photolithographic processing of integrated circuits and other types of devices.

SUMMARY OF THE PRESENT INVENTION

According to the present invention a method of etching using an $O_2$ microwave plasma which has a preselected, predetermined degree of selectivity between two materials such as polyimide and photoresist constituting a composite is provided. This method comprises the steps of selecting the degree of selectivity desired between the two materials; and determining the etch rate of each of the materials at various temperatures and at least one pressure. From the etch rates selecting a temperature and pressure which will provide the degree of selectivity desired and then etching the composite at the selected temperature and pressure downstream from an $O_2$ microwave plasma which will cause the degree of selectivity of removal of material which is desired.

DESCRIPTION OF THE DRAWINGS

FIG. 1 is a diagrammatic view of a microwave plasma generating device used for the method of this invention;

FIGS. 7, 8 and 9 are sectional views somewhat schematic showing the utilization of the present method at various degrees of selectivity for etching of composite materials.

DESCRIPTION OF THE PREFERRED EMBODIMENT

Figure 2:
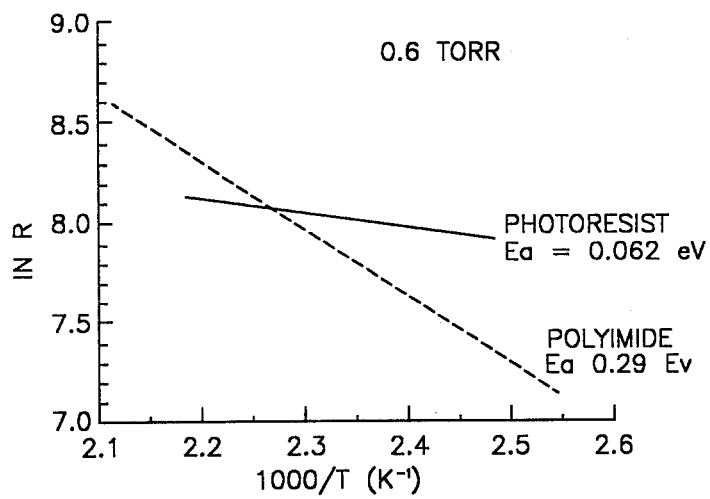
FIGS. 2, 3 and 4 are plotted graphs of etch rates of a negative photoresist material and a polyimide material as they vary with temperature at three different pressure levels.

As indicated above, it is frequently necessary to provide a certain selected degree of selectivity of etch rate between two materials in a composite structure of the two materials. One particular application for this required selectivity is in the etching of composite structures of photoresist and polyimide where, depending upon the end result desired, it may be desirable to etch the resist material without significantly etching away a polyimide in some instances whereas in other instances it may be desirable to etch the polyimide material; and not significantly etch the photoresist material and in other instances, it may be desirable to provide an etch rate which is substantially equal for both materials in the composite.

The present method provides a technique for selecting and/or providing for the desired degree of selectivity of etch rate between the two materials and specifically between a photoresist material and a polyimide to provide the desired end result.

As a first step in the practice of the invention, it is necessary to determine the etch rate of each of the materials in a composite stack of materials which are to be etched selectively. This can be done in a conventional manner utilizing conventional equipment such as the type shown in FIG. 1 wherein a sample 10 of a material to be tested is placed on a heater support 12 which is mounted at an angle in a chamber 14 which is connected through opening 16 to a vacuum pump. The plasma is generated by a plasma generator 20 which can be operated preferably at 2.45 $GH_z$ and $O_2$ is supplied to the chamber 14 through a tube 22. The temperature of the sample 10 can be controlled by controlling the heat of the heater 12 and the degree of pressure or the degree of vacuum within the chamber 14 can be controlled by controlling the vacuum pump 16, for example by the use of a throttling valve.

Each sample of material is placed on the heater and a given vacuum is maintained within the chamber and etching is accomplished at various temperatures which are controlled by the heater support 12. For the present embodiment, the etching rate of polyimide material sold by DuPont under the trademark Kapton was measured and also the etch rate of KTFR (Trademark of Eastman Kodak) a negative photoresist material. Each of the materials were heated to various temperatures at three different pressures, i.e. 0.6 Torr, 1.2 Torr, and 1.8 Torr. The amount of material removed at each temperature and pressure was measured for each sample. These values are shown in Table I.

TABLE I

| Material | Temperature (°C.) | Pressure (Torr) | Etch Rate Å/Min |
|---|---|---|---|
| Polyimide | 120 | 0.6 | 133 |
|  | 180 | 0.6 | 2975 |
|  | 200 | 0.6 | 6506 |
|  | 120 | 1.2 | 1286 |
|  | 180 | 1.2 | 3180 |
|  | 200 | 1.2 | 7347 |

TABLE I-continued

| Material | Temperature (°C.) | Pressure (Torr) | Etch Rate Å/Min |
|---|---|---|---|
| | 130 | 1.8 | 1233 |
| | 170 | 1.8 | 2293 |
| | 180 | 1.8 | 5248 |
| | 200 | 1.8 | 8867 |
| Negative | 130 | 0.6 | 2632 |
| Photoresist | 162 | 0.6 | 3390 |
| | 185 | 0.6 | 3200 |
| | 124 | 1.2 | 3636 |
| | 159 | 1.2 | 4796 |
| | 187 | 1.2 | 5333 |
| | 117 | 1.8 | 3333 |
| | 154 | 1.8 | 4444 |
| | 189 | 1.8 | 8584 |

Figure 3:
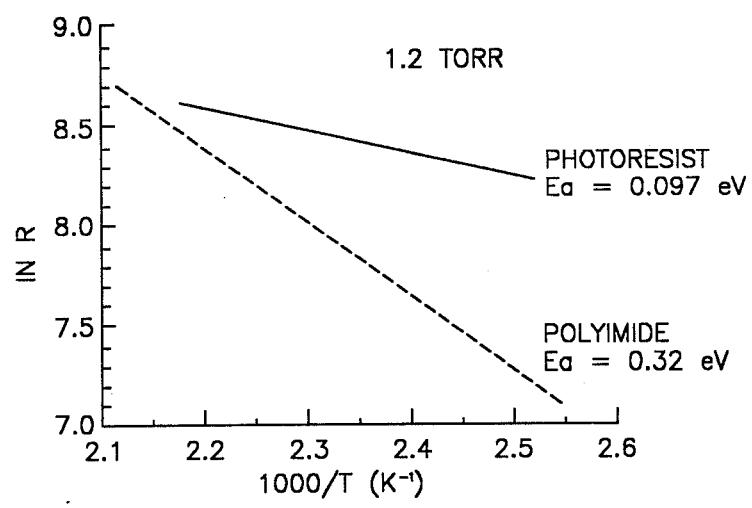
Figure 4:
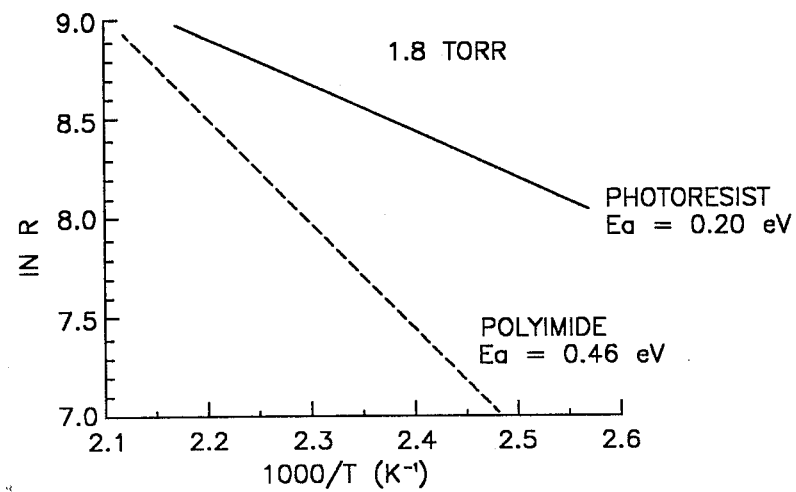

The results listed in Table I were plotted as a function of temperature for each of the three pressures, these plots being depicted in FIGS. 2, 3 and 4 for the pressures 0.6 Torr, 1.2 Torr and 1.8 Torr respectively. In each of the graphs, the function of the amount of material removed was plotted on the ordinate and the temperature function was plotted on the abscissa. This type of graphing is conventional and well-known in the art and, according to convention, in FIGS. 2, 3 and 4, the amount of material removed is plotted as the natural log of the material removal rate (R), here expressed in angstroms per minute. The temperature function is plotted as an inverse function and is plotted as 1,000 over the temperature in degrees Kelvin. Thus in these graphs, the amount of material removed increases going up the ordinate and the temperature decreases going from the ordinate to the right on the abscissa. The slope of each curve is proportional to the activation energy, which has been calculated and is listed on each curve.

As is apparent, especially from examination of FIG. 2, at a pressure of 0.6 Torr, the rate of removal for both the photoresist and the polyimide is identical at a graph point of about 2.27 which represents a temperature of about 170° C. At temperatures lower than this, i.e. going right on the ordinate, it can be seen that the rate of removal of the photoresist becomes progressively faster with respect to the rate of removal to the polyimide and conversely going to the left of this point which represents an increase in temperature, the rate of the removal of the polyimide becomes progressively faster than the rate of removal of the photoresist. This same function, although not quite so pronounced, can also be determined from the examination of FIG. 3 which is a similar graph but plots the rate of removal as a function of temperature at 1.2 Torr. Again, in FIG. 4 which is a graph of a similar function at 1.8 Torr, the lines do not cross until a much higher temperature.

Figure 5:
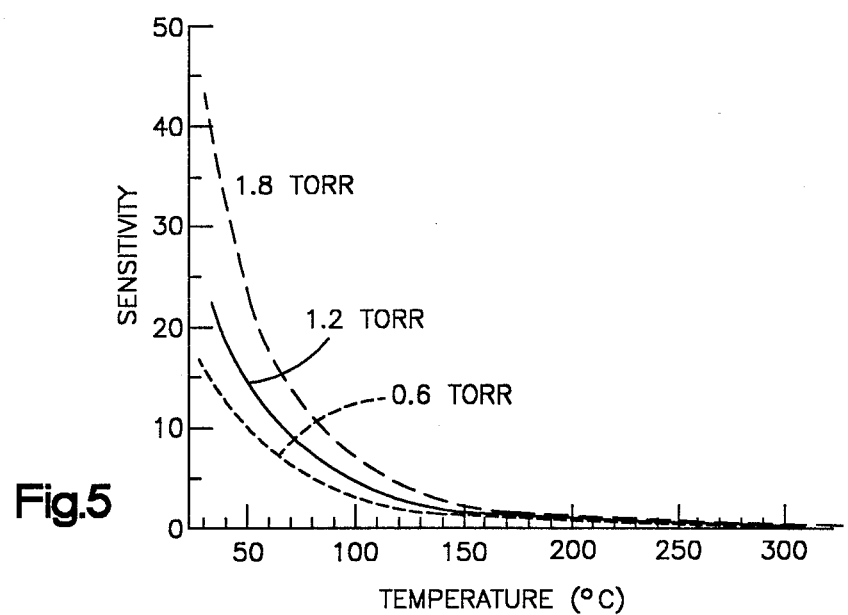
FIG. 5 is a plotted graph of the selectivity factor of the etch rate between a negative photoresist and polyimide as a function of temperature at various pressure levels.

By constructing the graphs in accordance with FIGS. 2, 3, and 4, the degree of selectivity of removal of one material with respect to the other can be established. This degree of selectivity is defined as the rate of removal of photoresist material divided by the rate of removal of the polyimide material at any given temperature and pressure. A plot of the selectivity value is shown in FIG. 5 with three curves being drawn for the selectivities at 1.8 Torr, 1.2 Torr and 0.6 Torr.

Figure 6:
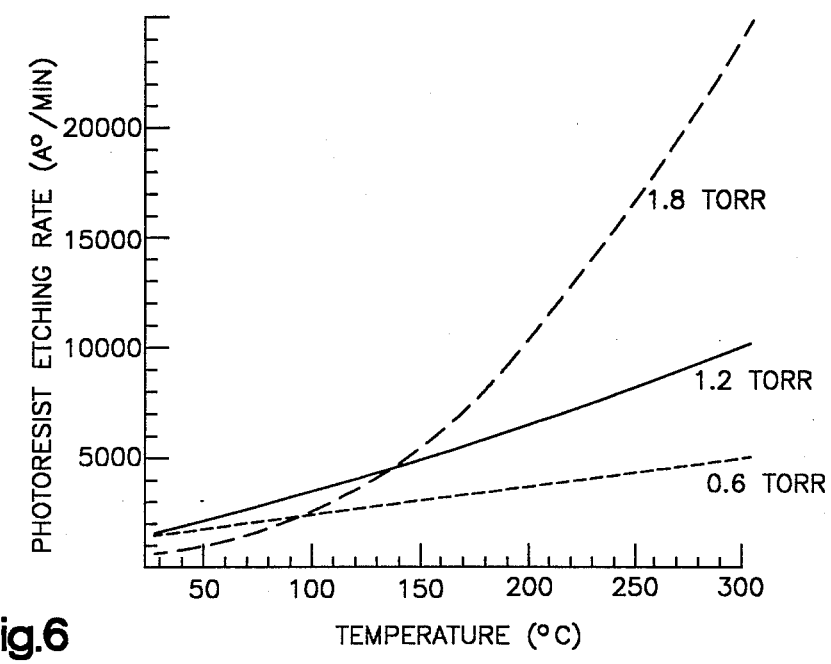
FIG. 6 is a graph showing the etch rate of a negative photoresist as it varies with temperature at three different pressures.

FIG. 6 shows the photoresist etch rate as a function of temperatures drawn in a more conventional manner where temperatures increase along the abscissa to the right and the etch rate of the photoresist increases going up the ordinate.

FIGS. 7, 8 and 9 depict situations where various degrees of selectivity are desired and the necessary selectivity can be selected, determined and then achieved by reference to the curves of FIGS. 2, 3, 4 and 5. For example, in FIG. 7, a layer of polyimide material 30 is deposited onto a ceramic substrate 32. A layer of photoresist material 34 has been applied over the polyimide 30 and has been patterned in a conventional manner and the polyimide 30 has been etched by conventional means. It is now desirable to remove the photoresist material without substantially affecting the polyimide structure. Thus for this type of application, it is desired to have a set of conditions which is highly selective to removing the photoresist material as opposed to the polyimide. From an examination of graphs shown in FIGS. 2, 3, 4 and 5, it is apparent that the lower the temperature and the higher the pressure the more the selectivity for the photoresist will be. Therefore, one would want to select a low temperature, e.g. in the range of 50° to 100° C. and a reasonably high pressure, i.e. 1.8 Torr, to get maximum selectivity.

In FIG. 8 a composite is shown wherein photoresist 34 has been patterned in a conventional manner overlying a polyimide 30 mounted on a ceramic substrate 32. In this case, however, it is desired to etch the polyimide 30, i.e. remove the exposed portion of the polyimide 30 while utilizing the photoresist material 34, as an etch mask. In this case, it will be determined from examination of the graphs one would select to use as high a temperature as can be used and the lowest pressure of 0.6 Torr. In this case, the polyimide would be removed selectively in preference to the photoresist. Indeed, in this particular case, both the etching of the polyimide and their removal of the photoresist could be done in a two-step process in a conventional tool. Again using FIG. 8 as an example, the composite structure of the polyimide and photoresist on the substrate could be first subjected to an etching operation at a high temperature and low pressure which would remove the revealed polyimide but would not affect the resist hence it would not affect the polyimide line beneath the resist. The photoresist then could be removed, if desired by changing the conditions within the tool to a low temperature and higher pressure which would selectively remove the photoresist leaving the underlying polyimide structure with the desired central opening etch therein.

FIG. 9 shows a situation wherein it is desired to have the etch remove the different materials at the same rate. In this figure, a substrate 32 is provided having metalization lines 36 formed thereon. The substrate and metalization is then covered with some type of conformal dielectric material 38 which can be an organic material similar to photoresist. The polyimide layer 30 overlies the conformal dielectric 38. In this case it is desired to perform what is known as a planarization operation wherein a given amount of material is to be removed to reveal the top of the metal line 36 at the left thereof. To do this, the polyimide has to be removed and some conformal dielectric material 38 has to be removed. At a certain point in the process both materials are being removed at the same time. In this particular instance it is then necessary to select conditions for the removal of the polyimide and the conformal dielectric to be at substantially the same rate. This can be accomplished by selecting a temperature and pressure where the curves cross. For example, the curves cross at about 170° C. as shown in FIG. 2 for the etching which takes place at 0.6 Torr resulting in a conformal flat top surface. This composite material could be etched at a temperature of 170° at 0.6 Torr which would result in a flat surface as shown in the dotted line in FIG. 9 (if the conformed material etched as the photoresist).

The above examples are merely a few illustrations of various types of selective etching which can be performed to provide the desired end results. The degree of selectivity is first predetermined or preselected. The etching rates of the two materials are determined at various temperatures and pressures and graphs are constructed of the etching rates as a function of various temperatures at certain selective pressures. The desired degree of selectivity of etching can then be selected from the constructed graphs and the composite of two materials etched in an $O_2$ microwave plasma process to provide this desired degree of selectivity.

Although several embodiments of this invention have been shown and described, various adaptations and application may be made without departing from the scope of the invention as defined by the appended claims.

What is claimed is:

1. A method of providing an etch in a $O_2$ microwave plasma which has a preselected degree of selectivity between two materials constituting a composite, comprising the steps of;

selecting the degree of selectivity desired;

determining the etch rate of each of the materials at various temperatures and at least one pressure, from said etch rates selecting a temperature and pressure which will provide the desired degree of selectivity;

and etching said composite at selected temperature and pressure in an $O_2$ microwave plasma to cause the degree of selectivity selected.

2. The method of claim 1 wherein one of said materials is a polyimide and one of said materials is an organic photoresist material.

3. The invention as defined in claim 2 wherein the etch rates are determined at a plurality of pressures at various temperatures.

4. The invention as defined in claim 2 wherein the etch rate for the photoresist is selected to be significantly greater than this etch rate for the polyimide.

5. The invention as defined in claim 2 wherein the etch rate for the polyimide is selected to be greater than the etch rate for the photoresist.

6. The invention as defined in claim 1 wherein the etch rate for the two materials is selected to be substantially equal.

* * * * *

UNITED STATES PATENT AND TRADEMARK OFFICE
CERTIFICATE OF CORRECTION

PATENT NO. : 4,869,777

DATED : September 26, 1989

INVENTOR(S) : M. Anschel et al

It is certified that error appears in the above-identified patent and that said Letters Patent is hereby corrected as shown below:

On the title page, under item [19] and in item [75], "Morris Apschel" should read --Morris Anschel--.

Signed and Sealed this

Twenty-second Day of December, 1992

Attest:

DOUGLAS B. COMER

Attesting Officer

Acting Commissioner of Patents and Trademarks